(12) United States Patent
Yang et al.

(10) Patent No.: US 11,329,022 B2
(45) Date of Patent: May 10, 2022

(54) PACKAGES FOR SEMICONDUCTOR DEVICES, PACKAGED SEMICONDUCTOR DEVICES, AND METHODS OF PACKAGING SEMICONDUCTOR DEVICES

(71) Applicant: Taiwan Semiconductor Manufacturing Company, Ltd., Hsinchu (TW)

(72) Inventors: Ching-Jung Yang, Pingzhen (TW); Yen-Ping Wang, Hemei Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 16/235,269

(22) Filed: Dec. 28, 2018

(65) Prior Publication Data

US 2019/0157238 A1    May 23, 2019

Related U.S. Application Data

(62) Division of application No. 14/755,795, filed on Jun. 30, 2015, now Pat. No. 10,170,444.

(51) Int. Cl.
*H01L 23/00* (2006.01)

(52) U.S. Cl.
CPC .............. *H01L 24/81* (2013.01); *H01L 24/11* (2013.01); *H01L 24/13* (2013.01); *H01L 24/14* (2013.01); *H01L 2224/0401* (2013.01); *H01L 2224/05548* (2013.01); *H01L 2224/05567* (2013.01); *H01L 2224/11003* (2013.01); *H01L 2224/1111* (2013.01); *H01L 2224/1184* (2013.01); *H01L 2224/1191* (2013.01); *H01L 2224/11334* (2013.01); *H01L 2224/13015* (2013.01); *H01L 2224/13019* (2013.01); *H01L 2224/13022* (2013.01); *H01L 2224/1403* (2013.01); *H01L 2224/14051* (2013.01); (Continued)

(58) Field of Classification Search
CPC ......... H01L 24/81; H01L 24/11; H01L 24/13; H01L 24/14; H01L 2224/0401
USPC ....................................................... 257/738
See application file for complete search history.

(56) References Cited

U.S. PATENT DOCUMENTS 3,900,432 A * 8/1975 Marcus ............ H01C 17/06533
                                                    252/519.1
4,287,288 A   9/1981 Pigeon et al.
(Continued)

OTHER PUBLICATIONS

Harzendorf, T., et al., "Half-Tone Proximity Lithography," Proc. SPIE, vol. 7716, Micro-Optics, May 2010, pp. 1-11.
(Continued)

*Primary Examiner* — Ori Nadav
(74) *Attorney, Agent, or Firm* — Slater Matsil, LLP

(57) ABSTRACT

Packages for semiconductor devices, packaged semiconductor devices, and methods of packaging semiconductor devices are disclosed. In some embodiments, a package for a semiconductor device includes an integrated circuit die mounting region, a molding material around the integrated circuit die mounting region, and an interconnect structure over the molding material and the integrated circuit die mounting region. The interconnect structure has contact pads, and connectors are coupled to the contact pads. Two or more of the connectors have an alignment feature formed thereon.

20 Claims, 11 Drawing Sheets

(52) U.S. Cl.
CPC ........... *H01L 2224/14179* (2013.01); *H01L 2224/81141* (2013.01); *H01L 2224/81193* (2013.01); *H01L 2224/81815* (2013.01)

(56) References Cited

U.S. PATENT DOCUMENTS

| | | | |
|---|---|---|---|
| 5,219,117 A * | 6/1993 | Lin ................... | B23K 35/0244 228/246 |
| 5,324,569 A | 6/1994 | Nagesh et al. | |
| 5,812,378 A | 9/1998 | Fjelstad et al. | |
| 6,130,823 A | 10/2000 | Lauder et al. | |
| 6,193,143 B1 * | 2/2001 | Ishikawa ............ | H01L 21/4846 228/180.22 |
| 6,227,436 B1 | 5/2001 | Nishikawa et al. | |
| 6,800,950 B2 | 10/2004 | Teshima et al. | |
| 7,140,531 B2 * | 11/2006 | Shaeffer ............ | H05K 1/0293 228/248.1 |
| 7,141,877 B2 | 11/2006 | Abe et al. | |
| 7,507,655 B2 * | 3/2009 | Sakaguchi .......... | B23K 3/0623 438/613 |
| 7,564,115 B2 | 7/2009 | Chen et al. | |
| 7,589,543 B2 | 9/2009 | Yamada et al. | |
| 7,633,165 B2 | 12/2009 | Hsu et al. | |
| 7,780,063 B2 * | 8/2010 | Budd ................. | B23K 1/0016 228/180.22 |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,264,092 B2 | 9/2012 | Scheucher | |
| 8,278,152 B2 | 10/2012 | Liu et al. | |
| 8,361,842 B2 | 1/2013 | Yu et al. | |
| 8,426,961 B2 | 4/2013 | Shih et al. | |
| 8,497,575 B2 | 7/2013 | Yoon et al. | |
| 8,541,291 B2 * | 9/2013 | Furman .............. | H01L 21/563 438/108 |
| 8,652,941 B2 | 2/2014 | Indyk et al. | |
| 8,653,202 B2 | 2/2014 | Fujimaru et al. | |
| 8,669,174 B2 | 3/2014 | Wu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,802,504 B1 | 8/2014 | Hou et al. | |
| 8,803,292 B2 | 8/2014 | Chen et al. | |
| 8,803,306 B1 | 8/2014 | Yu et al. | |
| 8,803,316 B2 | 8/2014 | Lin et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,082,754 B2 * | 7/2015 | Gruber ............... | B23K 3/0623 |
| 9,721,919 B2 * | 8/2017 | Nah .................... | H01L 24/03 |
| 2001/0015012 A1 * | 8/2001 | Suzuki ............... | H01L 21/4853 29/876 |
| 2003/0060064 A1 | 3/2003 | Hirai et al. | |
| 2005/0056855 A1 | 3/2005 | Lin et al. | |
| 2007/0164199 A1 * | 7/2007 | Onodera ............ | H01L 21/4832 250/214.1 |
| 2008/0003805 A1 * | 1/2008 | Pang .................. | H01L 24/11 438/613 |
| 2008/0284048 A1 | 11/2008 | Kim et al. | |
| 2009/0004840 A1 * | 1/2009 | Farinelli ............. | H01L 24/11 438/616 |
| 2010/0230475 A1 * | 9/2010 | Buchwalter ........ | H01L 21/563 228/179.1 |
| 2010/0237482 A1 * | 9/2010 | Yang ................. | H01L 23/49816 257/686 |
| 2011/0068151 A1 | 3/2011 | Oh et al. | |
| 2011/0140271 A1 | 6/2011 | Daubenspeck et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0001645 A1 | 1/2014 | Lin et al. | |
| 2014/0203429 A1 | 7/2014 | Yu et al. | |
| 2014/0225222 A1 | 8/2014 | Yu et al. | |
| 2014/0225258 A1 | 8/2014 | Chiu et al. | |
| 2014/0252572 A1 | 9/2014 | Hou et al. | |
| 2014/0252646 A1 | 9/2014 | Hung et al. | |
| 2014/0264930 A1 | 9/2014 | Yu et al. | |
| 2015/0243623 A1 | 8/2015 | Wang et al. | |
| 2015/0303172 A1 | 10/2015 | Law et al. | |
| 2017/0005067 A1 | 1/2017 | Yang et al. | |
| 2017/0098627 A1 | 4/2017 | Das et al. | |

OTHER PUBLICATIONS

Quentel, F., et al., "Multilevel Diffractive Optical Element Manufacture by Excimer Laser Ablation and Halftone Masks," Proc. of SPIE, vol. 4274, 2001, pp. 420-431.

* cited by examiner

PACKAGES FOR SEMICONDUCTOR DEVICES, PACKAGED SEMICONDUCTOR DEVICES, AND METHODS OF PACKAGING SEMICONDUCTOR DEVICES This application is a divisional of U.S. patent application Ser. No. 14/755,795, entitled "Packages for Semiconductor Devices, Packaged Semiconductor Devices, and Methods of Packaging Semiconductor Devices," filed on Jun. 30, 2015, which application is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post-passivation interconnect (PPI) that is used to fan-out wiring for contact pads of the package so that electrical contacts may be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
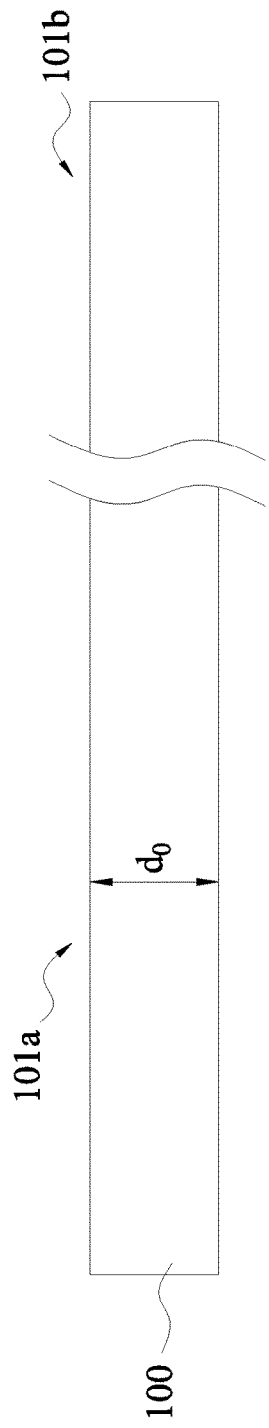
FIG. 1 illustrates a cross-sectional view of a plate for forming connectors of a package for a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages for semiconductor devices, packaged semiconductor devices, and methods of packaging semiconductor devices are disclosed in the present disclosure. Packaging devices will be described herein that include connectors with alignment features formed thereon. The connectors with alignment features comprise solder ball structures for low cost yield enhancement of packaging processes. The connectors with alignment features are implementable on interconnect structures and in packages for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate types of packaging, or the like. Throughout the various views and illustrative embodiments, like reference numerals are used to designate like elements.

Referring first to FIG. 1, a cross-sectional view of a plate 100 for forming connectors of a package for a semiconductor device in accordance with some embodiments of the present disclosure is shown. The plate 100 comprises glass in some embodiments. In some embodiments, the plate 100 comprises a borofloat glass plate. The material of the plate 100 may comprise glass with silica and boron trioxide as glass-forming constituents in some embodiments. The plate 100 may have a thickness comprising dimension $d_0$, wherein dimension $d_0$ comprises about 100 µm to about 800 µm, for example. The plate 100 may also comprise other materials and dimensions. A plate 100 comprising a borofloat glass plate may advantageously have a coefficient of thermal expansion (CTE) close to a CTE of a silicon wafer, for example.

Figure 2:
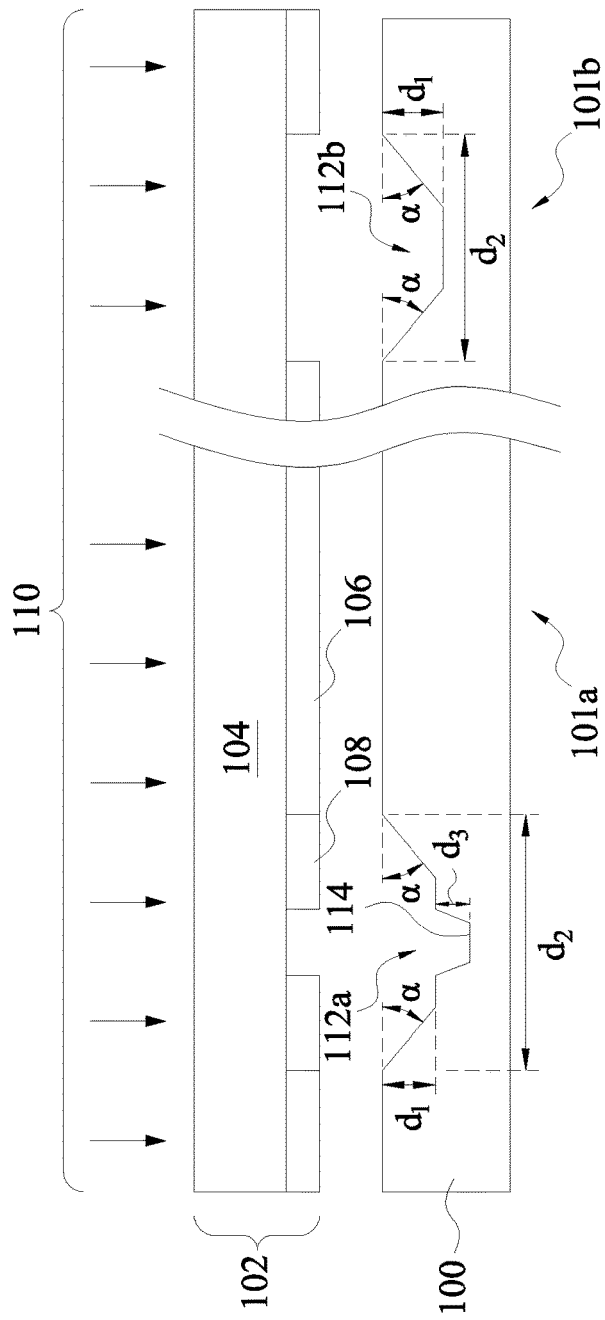
FIG. 2 is a cross-sectional view that illustrates a method of patterning the plate shown in FIG. 1 using a lithography process and a lithography mask in accordance with some embodiments.

In some embodiments, a patterned plate 100 is provided (see FIGS. 3 through 5) and is used to form connectors 120a and 120b on a packaged semiconductor device 130 (see FIGS. 6 through 11). In other embodiments, an unpatterned plate 100 is provided, as shown in FIG. 1, and the unpatterned plate 100 is patterned using a lithography mask 102 and a lithography process, as shown in FIG. 2. The lithography process may comprise a photolithography process or other type of lithography or patterning process, for example. The unpatterned plate 100 is patterned with a plurality of connector patterns 112a and 112b using the lithography mask 102 and the lithography process, as illustrated in FIG. 2 in a cross-sectional view and in FIG. 3 in a perspective view.

To pattern the unpatterned plate 100 shown in FIG. 1, a lithography mask 102 shown in FIG. 2 is provided that has a connector pattern formed thereon. The lithography mask 102 comprises a half-tone lithography mask in some embodiments. The half-tone lithography mask 102 may comprise a binary type mask that achieves a greyscale effect or multiple transmission levels when used in an optical system in some embodiments. The half-tone lithography mask 102 may also comprise other parameters and effects.

For example, the lithography mask 102 comprises a substantially transparent material 104 comprising glass or quartz in some embodiments. The lithography mask 102 includes a substantially opaque material 106 comprising chrome coupled to the transparent material 104 in some embodiments. The lithography mask 102 also includes a half-tone material 108 in predetermined locations. The half-tone material 108 may comprise MoSi in some embodiments, for example. The half-tone material 108 may also comprise a patterned portion of the opaque material 106 that has a pattern smaller than a resolution limit of an optical exposure system used for the lithography process in some embodiments, for example. The opaque material 106 and half-tone material 108 comprise a material and shape adapted to produce relief patterns (i.e., three-dimensional (3D) patterns) on the plate 100 in some embodiments, such as alignment patterns 114 within connector patterns 112a on the plate 100. The transparent material 104 of the lithography mask 102 may comprise a thickness of about 7 mm to about 9 mm. The opaque material 106 of the lithography mask 102 may comprise a thickness of about 7 mm to about 9 mm. The half-tone material 108 of the lithography mask 102 may comprise a thickness of about 50 nm to about 200 nm. The transparent material 104, opaque material 106, and half-tone material 108 of the lithography mask 102 may also comprise other materials, properties, and dimensions.

The opaque material 106 comprises a pattern for a plurality of connector patterns 112a and 112b of the plate 100, and the half-tone material 108 comprises a pattern for an alignment pattern 114 on some of the plurality of connector patterns 112a in predetermined locations of the plate 100, as illustrated in region 101a of the plate 100 in FIG. 2. Other connector patterns 112b do not include an alignment pattern 114 on the lithography mask 102 within the half-tone material 108, as illustrated in region 101b of the plate 100.

To pattern the plate 100, the plate 100 is exposed to energy or light 110 through or reflected from the lithography mask 102. In some embodiments, a layer of photoresist (not shown) is deposited over the plate 100, and the layer of photoresist is patterned by exposure to the energy or light 110 through or reflected from the lithography mask 102. The layer of photoresist is then developed, and exposed or unexposed regions (depending on whether the layer of photoresist is positive or negative) are removed. The layer of photoresist is then used as an etch mask during an etch process for the plate 100. The layer of photoresist is then removed from the plate 100.

The patterned plate 100 shown in FIG. 2 includes connector patterns 112a in regions 101a that include an alignment pattern 114 formed thereon. Other regions 101b of the plate 100 include connector patterns 112b that do not include an alignment pattern 114 formed thereon. The arrangement of the connector patterns 112a and 112b comprises an overall shape of an array of rows and columns in some embodiments. The array may be fully or partially populated. The arrangement of the connector patterns 112a and 112b is selected to correspond with an arrangement of contact pads on an interconnect structure that connectors will be formed on.

The connector patterns 112a and 112b comprise cavities having a depth within the plate 100 comprising dimension $d_1$, wherein dimension $d_1$ comprises about 50 µm to about 400 µm, for example. The cavities of the connector patterns 112a and 112b comprise a width proximate a surface of the plate 100 comprising dimension $d_2$, wherein dimension $d_2$ comprises about 50 µm to about 400 µm, for example. A lower portion of the connector patterns 112a and 112b comprises a width that is less than the width proximate the surface of the plate 100 comprising dimension $d_2$ in some embodiments. The cavities of the connector patterns 112a and 112b comprise a re-entrant angle $\alpha$ between a top surface of the plate 100 and a sidewall of the cavities of the connector patterns 112a and 112b, wherein the re-entrant angle $\alpha$ comprises about 30 degrees to about 90 degrees in some embodiments. The angle $\alpha$ comprises an amount that is sufficient to provide a desired shape and size of connectors 120a and 120b that are later formed in the connector patterns 112a and 112b of the plate 100 in some embodiments, for example. In embodiments wherein the re-entrant angle α comprises about 90 degrees, the lower portion of the connector patterns 112a and 112b comprises a width that is about the same as dimension $d_2$ in some embodiments, for example. The alignment pattern 114 of connector patterns 112a comprises a depth within the plate 100 (e.g., beneath a portion of the connector pattern 112a for the connector) comprising dimension $d_3$, wherein dimension $d_3$ comprises about 10 μm to about 100 μm, for example. Dimensions $d_1$, $d_2$, $d_3$, and the re-entrant angle α may also comprise other values. The connector patterns 112a and 112b comprise a cavity aspect ratio (e.g., width/height) that is derived from solder bump volume for connectors 120a and 120b that will be formed using the plate 100 in some embodiments, for example.

In some embodiments, two or more of the connector patterns 112a include alignment patterns 114 formed thereon. In other embodiments, three or more of the connector patterns 112a include alignment patterns 114 formed thereon. In yet other embodiments, four or more connector patterns 112a include alignment patterns 114 formed thereon.

Figure 3:
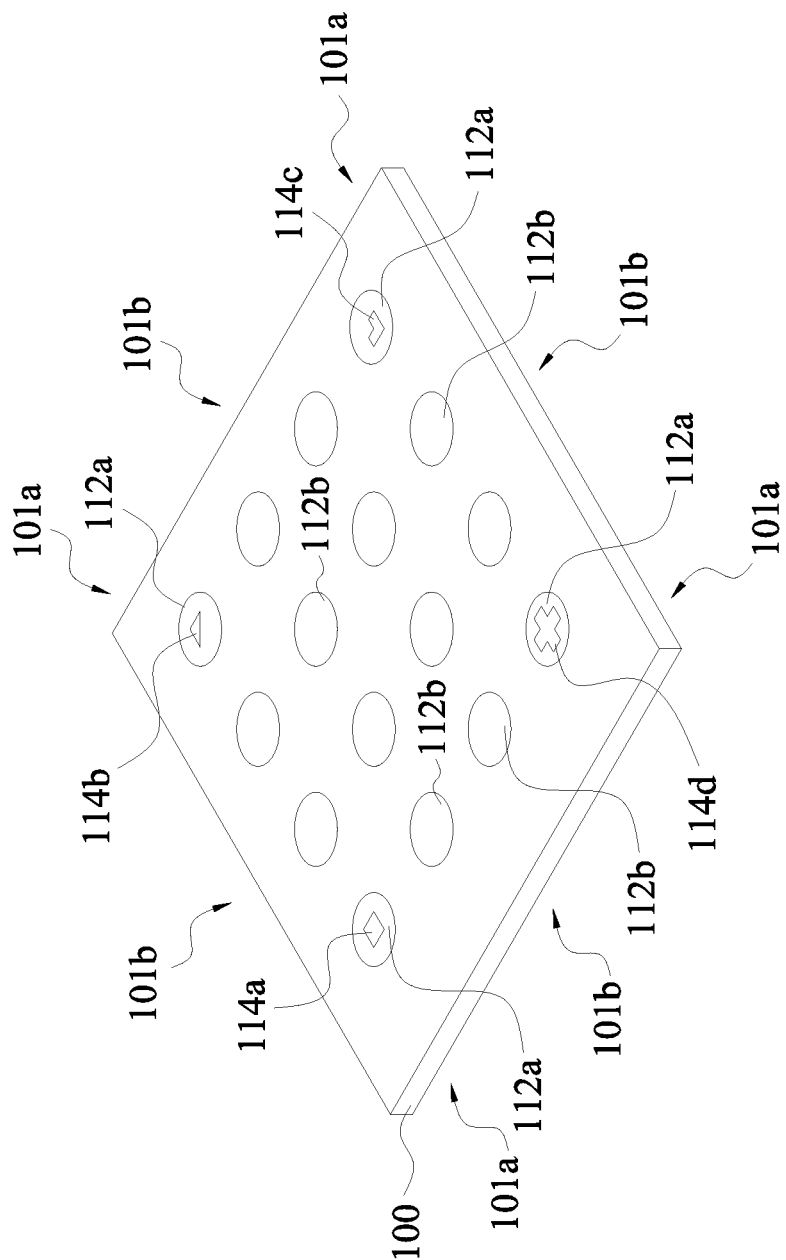
FIG. 3 is a perspective view illustrating a patterned plate shown in FIG. 2 in accordance with some embodiments of the present disclosure.

For example, in FIG. 3, a perspective view is shown of a plate 100 shown in FIG. 2 having four connector patterns 112a formed thereon, with a connector pattern 112a being disposed in each corner of the plate 100 in regions 101a. Some examples of shapes of the alignment patterns 114 of the connector patterns 112a are illustrated in FIG. 3. The shapes of the alignment patterns 114 comprise various predetermined marks. In accordance with some embodiments, the alignment patterns 114 of the connector patterns 112a in regions 101a of the plate 100 may comprise a shape of a cross, a line, a plurality of lines, a square, a rectangle, a triangle, a polygon, a ring, a circle, an oval, a numeral, a letter, and/or a combination thereof in some embodiments, as examples. The alignment patterns 114 may also comprise other shapes and may be located on connector patterns 112a in other locations on the plate 100.

Figure 4:
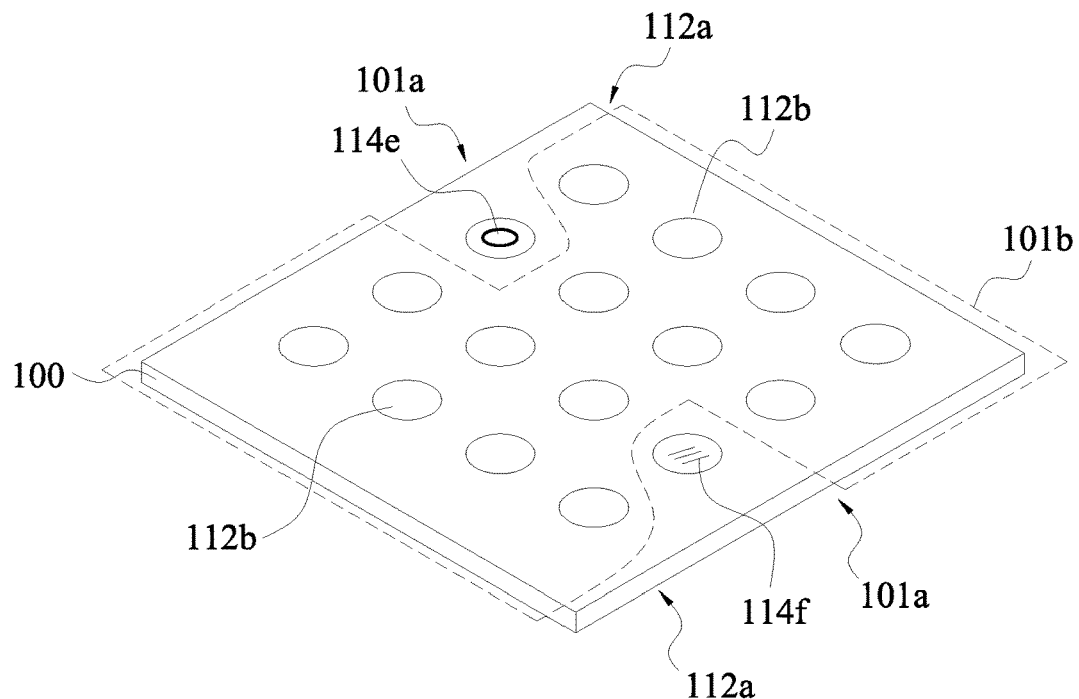
FIG. 4 is a perspective view that illustrates a patterned plate shown in FIG. 2 in accordance with some embodiments.
Figure 5:
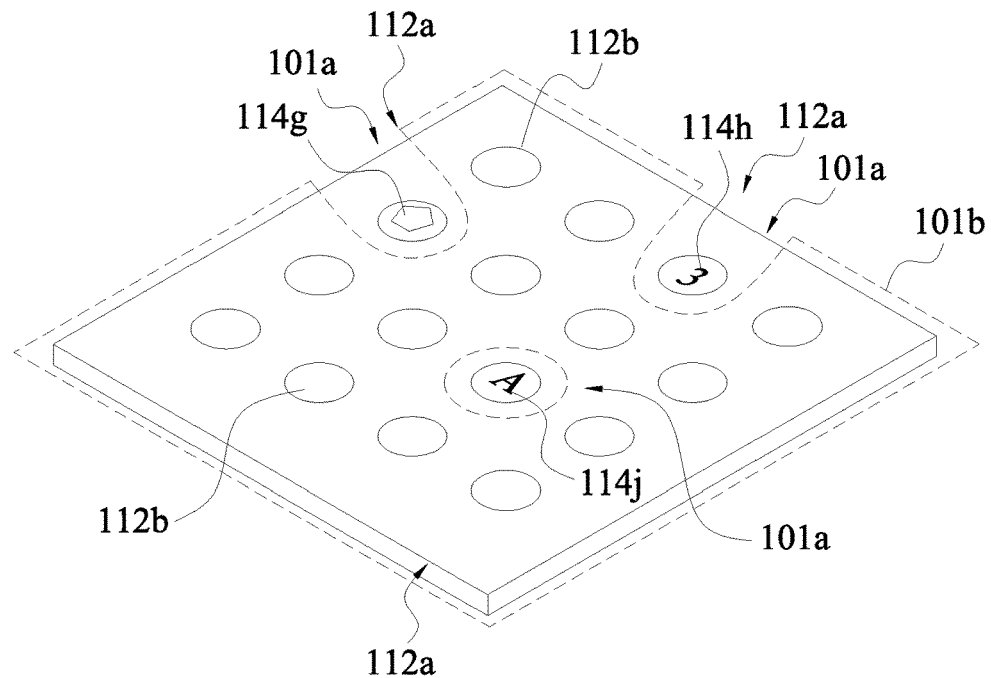
FIG. 5 is a perspective view illustrating a patterned plate shown in FIG. 2 in accordance with other embodiments.

For example, in FIG. 3, alignment pattern 114a comprises a shape of a square, and alignment pattern 114b comprises a shape of a triangle. Alignment pattern 114c comprises a shape of a letter L, and alignment pattern 114d comprises a shape of a cross or a letter X. The alignment patterns 114 may also comprise other shapes and may be placed in other locations on the plate 100, as shown in FIGS. 4 and 5. The alignment patterns 114 may comprise the same shape on the plate 100, or the alignment patterns 114 may be different, as shown in FIG. 3. The other connector patterns 112b in regions 101b of the plate 100 do not include an alignment pattern 114 formed thereon.

FIG. 4 is a perspective view illustrating a patterned plate 100 shown in FIG. 2 in accordance with some embodiments. The connector patterns 112a that include alignment patterns 114 formed thereon are formed in non-corner regions of the plate 100. Connector patterns 112a are located on edges of the plate 100 in the embodiments shown, for example. In accordance with some embodiments, at least two of the connector patterns 112a include the alignment patterns 114, so that the at least two connectors 120a formed in the connector patterns 112a may be used for alignment of a packaged semiconductor device 130 (see FIG. 18). The other connector patterns 112b do not include an alignment pattern 114 formed thereon.

In FIG. 4, alignment pattern 114e comprises a shape of a ring, circle, a letter O, or a numeral 0. Alignment pattern 114f comprises a shape of a plurality of lines in the embodiments shown. Alignment patterns 114e and 114f in regions 101a of the plate 100 may also comprise other shapes and may be positioned in other locations on the plate 100. For example, the two or more connector patterns 112a that include the alignment patterns 114e and 114f may be located in a corner of the plate 100, an edge region of the plate 100, and/or an interior region of the plate 100.

FIG. 5 is a perspective view illustrating a patterned plate 100 shown in FIG. 2 in accordance with other embodiments. Another exemplary arrangement of connector patterns 112a that include alignment patterns 114 disposed thereon is shown. Three connector patterns 112a include alignment patterns 114g, 114h, and 114j in the embodiments shown. Alignment pattern 114g comprises a shape of a polygon. Alignment pattern 114g comprises a hexagon in the embodiments shown, for example. Alignment pattern 114h comprises a shape of a numeral 3, and alignment pattern 114j comprises a shape of a letter A in the embodiments shown. The alignment patterns 114h and 114j may also comprise a shape of other numerals and/or letters. The alignment patterns 114g, 114h, and 114j may also comprise other shapes and may be located in other regions of the plate 100.

Figure 6:
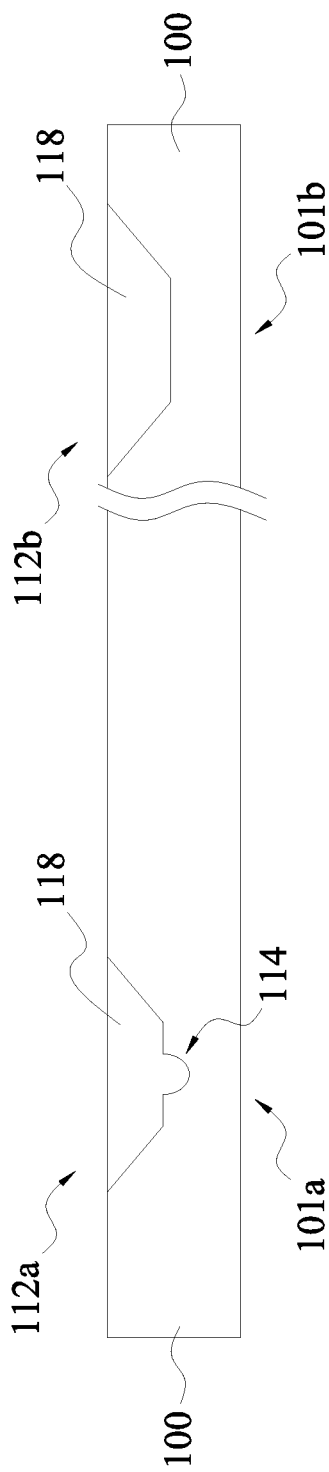
FIGS. 6 through 10 are cross-sectional views that illustrate a method of forming connectors on a portion of a packaged semiconductor device at various stages using a patterned plate shown in FIGS. 3 through 5 in accordance with some embodiments.

FIGS. 6 through 10 are cross-sectional views that illustrate a method of forming connectors 120a and 120b on a packaged semiconductor device 130 using a patterned plate 100 shown in FIGS. 2 through 5 at various stages in accordance with some embodiments. In FIG. 6, a connector material 118 is formed on the plate 100 within the connector patterns 112a and 112b of the plate 100. The connector material 118 comprises a eutectic material such as solder. The use of the word "solder" herein includes both lead-based and lead-free solders, such as Pb-Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder connectors may also include tin and silver, Sn-Ag, without the use of copper. The connector material 118 is formed using a spin-on process, a solder bath, or solder paste printing, as examples. The connector material 118 may also be formed using other methods and may comprise other materials.

Figure 7:
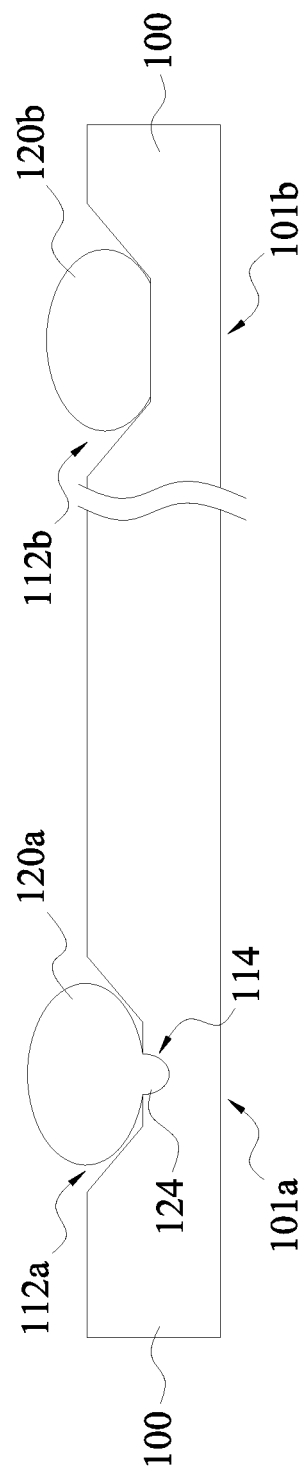

The connector material 118 is then heated to a predetermined temperature, e.g., to a melting point of the eutectic material of the connector material 118, such as about 150 degrees C. to about 270 degrees C., to reflow the connector material 118 and form substantially spherical-shaped connectors 120a and 120b, as shown in FIG. 7. In some embodiments, the connectors 120a and 120b may comprise solder bumps or solder balls, as examples. The connectors 120a and 120b comprise conductive balls having a shape of a partial sphere in some embodiments. The connectors 120a and 120b may have a height of about 500 μm or less, or about 480 μm, in some embodiments. The connectors 120a and 120b may also comprise other dimensions and shapes. The connectors 120a and 120b may also comprise non-spherical conductive connectors, for example. The connectors 120a and 120b may be included in an array of the connectors 120a and 120b as a grid, referred to as a "ball grid array" or "BGA". The connectors 120a and 120b may also be arranged in other shapes.

Figure 8:
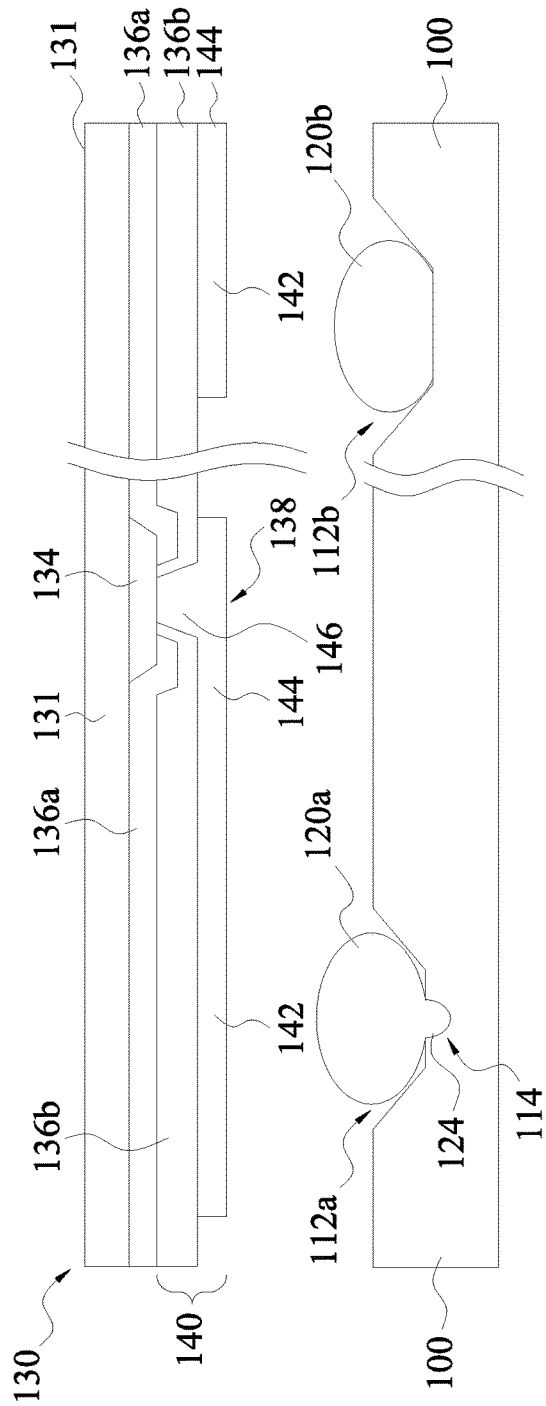
Figure 9:
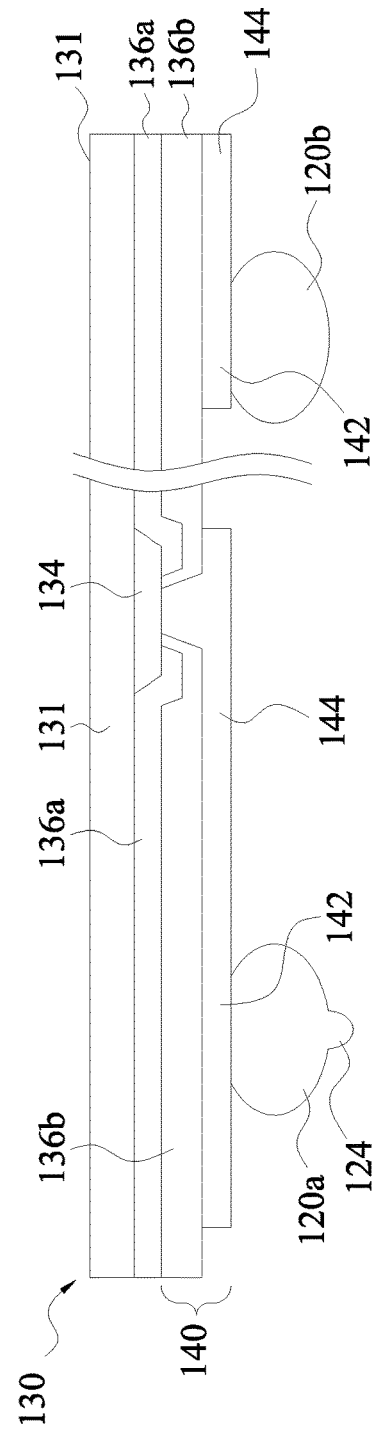
Figure 10:
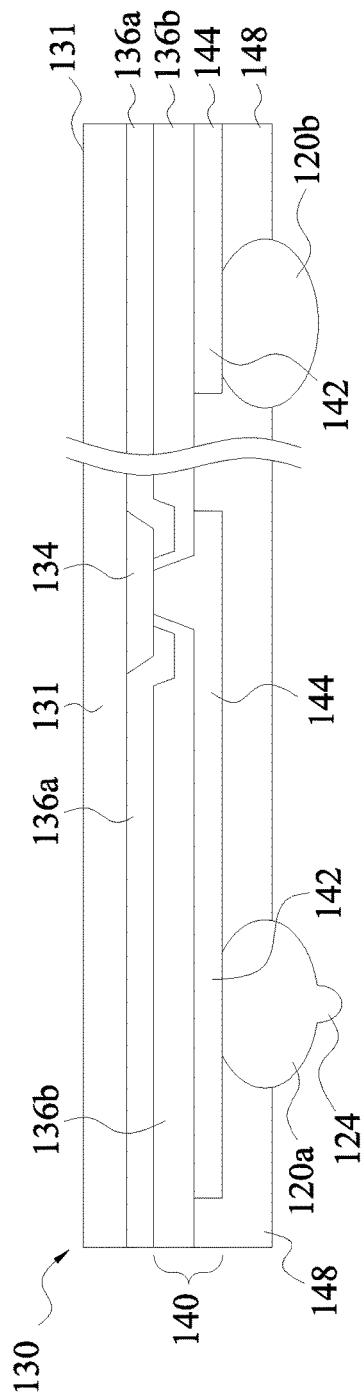

A packaged semiconductor device 130 is provided, as shown in FIG. 8. The packaged semiconductor device 130 includes an integrated circuit die 131 that has been partially packaged and that comprises an interconnect structure 140 that includes a plurality of contact pads 142 disposed thereon. A portion of the packaged semiconductor device 130 is shown in FIGS. 8 through 10, and two of the contact pads 142 are illustrated in the drawings. Dozens, hundreds, or more of the contact pads 142 may be formed on the surface of the interconnect structure 140. One or more insulating material layers 136a and 136b of the interconnect structure 140 are formed over the integrated circuit die 131 and over portions of the contacts 134 of the integrated circuit die 131. The insulating material layers 136a and 136b comprise a polymer material in some embodiments, for example. An opening is formed in the insulating material layers 136a and 136b over the contacts 134 of the integrated circuit die 131 so that electrical connections may be made to the contacts 134 by conductive material of the interconnect structure 140.

The interconnect structure 140 comprises a redistribution layer (RDL) or post-passivation interconnect (PPI) in some embodiments. The interconnect structure 140 includes a plurality of conductive lines 144 that are coupled to the contact pads 142. In some embodiments, the conductive lines 144 comprise PPI lines and the contact pads 142 comprise PPI pads, for example. The conductive lines 144 may include via portions 146 that extend through openings in the insulating material layers 136a and 136b to make electrical contact with the contacts 134.

Generally, the via portions 146 and conductive lines 144 provide electrical connections from contacts 134 of the integrated circuit die 131 to the contact pads 142. The contact pads 142 comprise an enlarged region disposed over the insulating material layer 136b that is designed to accommodate an external electrical connection by a connector 120a or 120b. The contact pads 142 are generally circular or oval in shape in a top or bottom view of the packaged semiconductor device 130, although other shapes may be used. The conductive lines 144 may have a narrow, wide, or tapered shape. The conductive lines 144 may comprise a substantially constant thickness and width. The conductive lines 144 may comprise a shape of straight lines or may comprise a meandering shape. The conductive lines 144 may also comprise other shapes.

The diameter or width of the contact pads 142 comprises about 250 µm or less, or about 170 µm to about 190 µm, in some embodiments. The diameter or width of the contact pads 142 may also comprise other values, such as about 250 µm or greater. The via portions 146 may comprise a diameter of about 20 µm to about 150 µm in some embodiments. The diameter of the via portions 146 may also comprise other values. Adjacent conductive lines 144 may be spaced apart from one another by a predetermined amount, such as about 50 µm or less. The conductive lines 144 may also be spaced apart by other dimensions.

The connector patterns 112a and 112b of the plate 100 comprise substantially the same layout as the contact pads 142 of the interconnect structure 140 of the packaged semiconductor device 130. The connector patterns 112a and 112b are designed to match an underball metallization (UBM) contact pad 142 pattern of the packaged semiconductor device 130 in some embodiments. The plate 100 is used as a tool to form and attach the connectors 120a and 120b formed in the connector patterns 112a and 112b of the plate 100 to the contact pads 142 of the interconnect structure 140 of the packaged semiconductor device 130 in some embodiments, for example. The plate 100 is positioned in close proximity to the packaged semiconductor device 130 so that the connectors 120a and 120b are adjacent and aligned with the contact pads 142 of the interconnect structure 140, as shown in FIG. 8.

The material of the connectors 120a and 120b is then re-heated to the melting point of the material of the connectors 120a and 120b, re-flowing the material of the connectors 120a and 120b and mechanically and electrically coupling the connectors 120a and 120b to the contact pads 142 of the interconnect structure 140. The plate 100 is then removed, as shown in FIG. 9, leaving the connectors 120a and 120b attached to the packaged semiconductor device 130.

Figure 19:
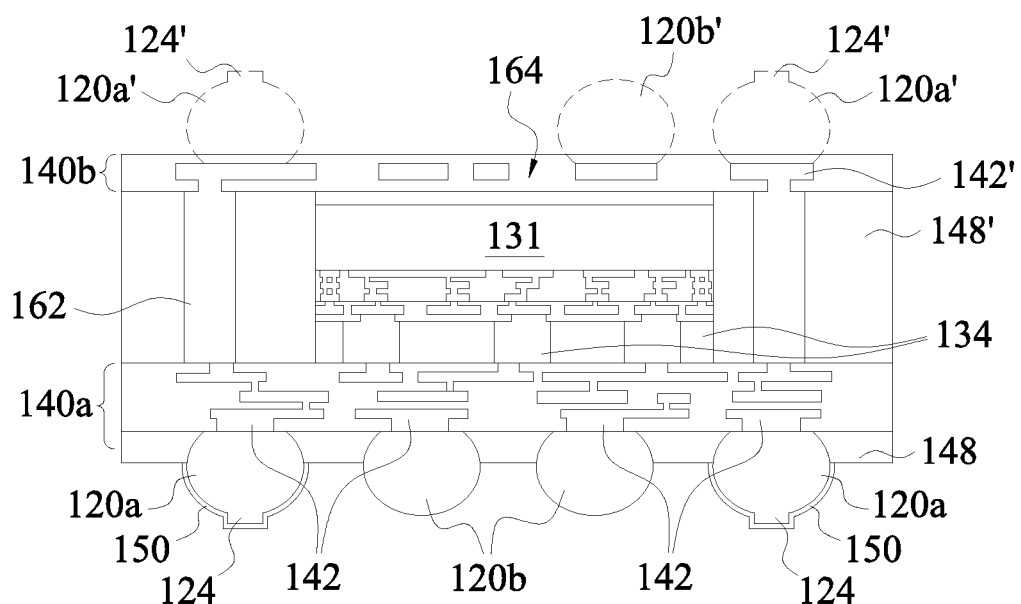
FIG. 19 is a cross-sectional view of a packaged semiconductor device in accordance with some embodiments that includes the connectors with alignment features.

In some embodiments, a first molding material 148 is applied around the connectors 120a and 120b over the interconnect structure 140, as shown in FIG. 10. A more detailed view of the packaged semiconductor device 130 is illustrated in FIG. 19, illustrating a second molding material 148' disposed around the integrated circuit die 131, through-vias 162 formed in the second molding material 148', and other additional elements of the packaged semiconductor device 130, which will be described further herein. In some embodiments, the first molding material 148 is not included.

Figure 11:
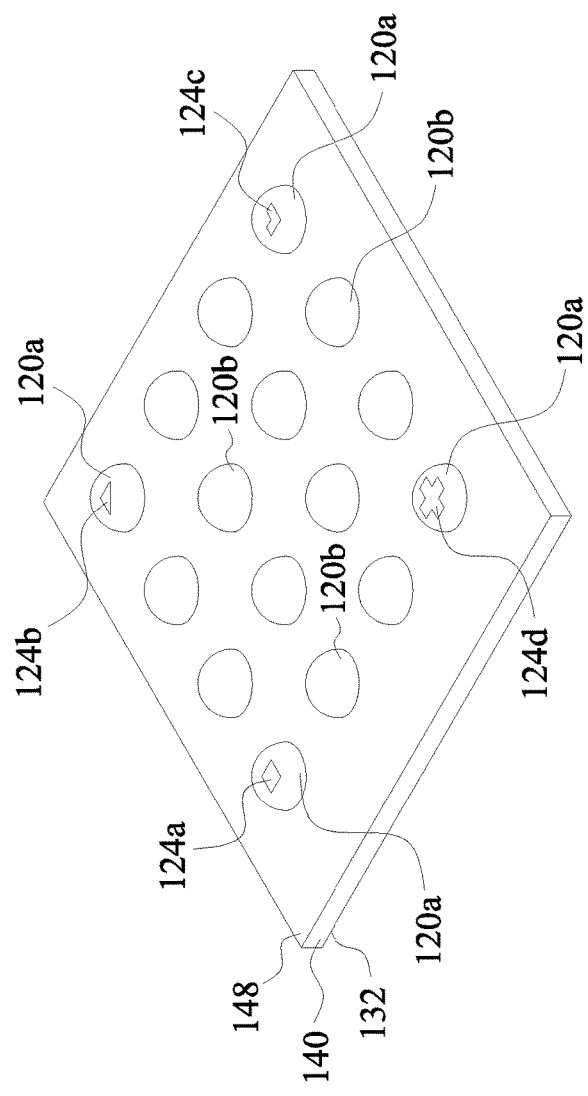
FIG. 11 is a perspective view of a packaged semiconductor device that illustrates connectors formed on the packaged semiconductor device using the patterned plate shown in FIG. 3 in accordance with some embodiments.
Figure 12:
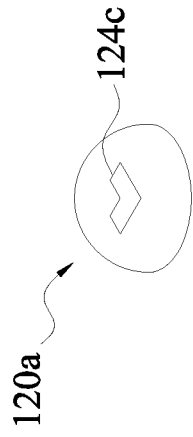
FIGS. 12 through 15 are more detailed perspective views that illustrate the connectors with alignment features disposed thereon shown in FIG. 11 in accordance with some embodiments.
Figure 13:
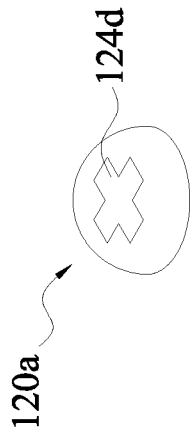
Figure 14:
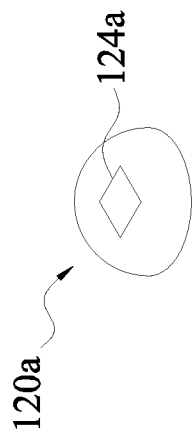
Figure 15:
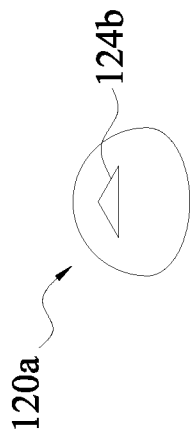

Some of the connectors 120a comprise alignment features 124 and others of the connectors 120b do not include an alignment feature 124 formed thereon, as shown in FIGS. 9 and 10 in a cross-sectional view and in FIG. 11 in a perspective view. Connectors 120a comprising alignment features 124 are also referred to herein as first connectors 120a, and connectors 120b that do not have alignment features 124 disposed thereon are also referred to herein as second connectors 120b.

The alignment features 124 of the first connectors 120a are formed from the alignment patterns 114 on the plate 100. Following re-flowing the eutectic material of the first connectors 120a (described earlier in FIG. 9), each of the first connectors 120a maintains the particular shape of the respective alignment pattern 114. Thus, the alignment features 124 of the first connectors 120a comprise substantially the same shape and size as the alignment patterns 114 on the plate 100, as illustrated in FIG. 11. For example, FIG. 11 illustrates an interconnect structure 140 comprising first connectors 120a having alignment features 124a, 124b, 124c, and 124d formed thereon from alignment patterns 114a, 114b, 114c, and 114d, respectively, shown in FIG. 3. In some embodiments, the alignment features 124a, 124b, 124c, and 124d are formed in the corners of the package to avoid input/output connector and contact pad usage, for example. FIGS. 12 through 15 are more detailed perspective views that illustrate connectors 120a with alignment features 124a, 124b, 124c, and 124d, respectively, disposed thereon in accordance with some embodiments.

Figure 16:
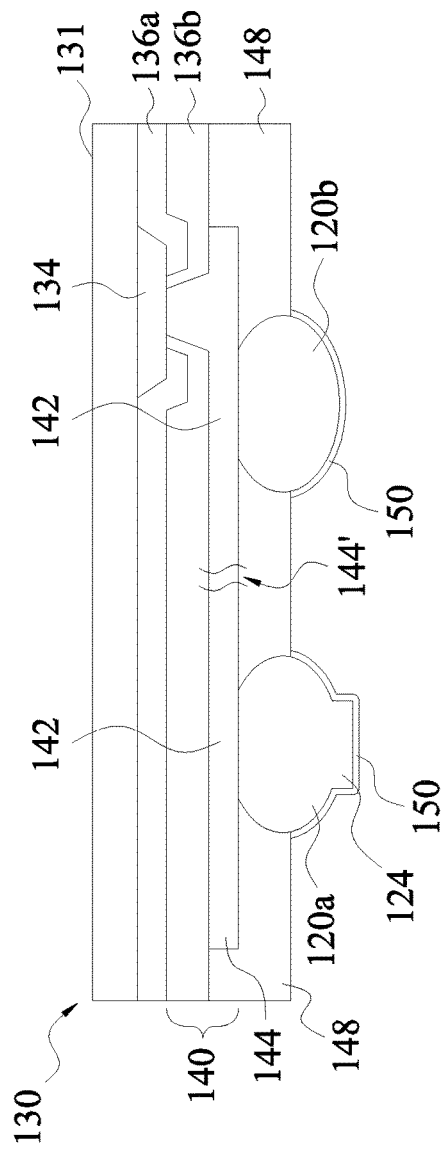
FIGS. 16 and 17 are cross-sectional views that illustrate methods of forming an insulating material on connectors with alignment features disposed thereon in accordance with some embodiments.
Figure 17:
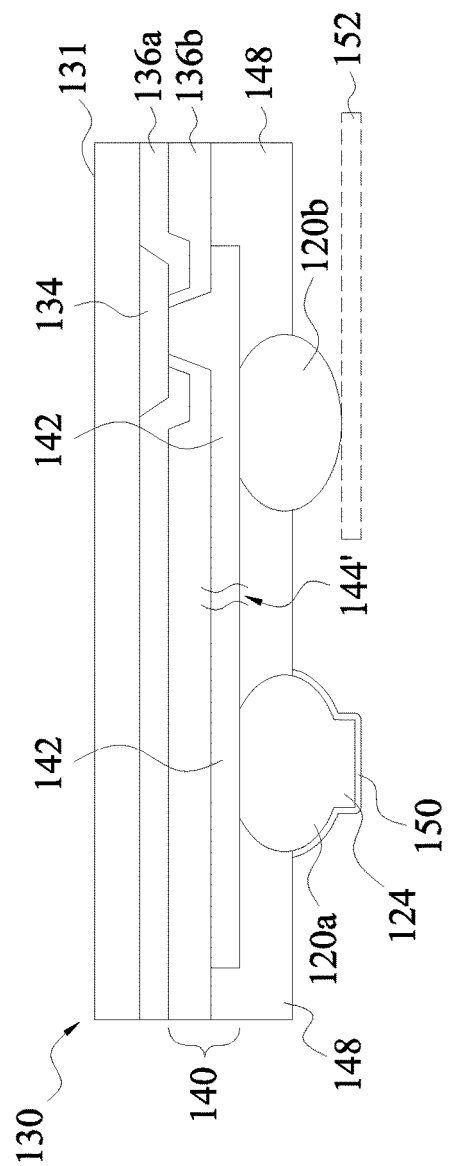

An insulating material 150 is formed on first connectors 120a having the alignment feature 124 formed thereon in some embodiments, as illustrated in FIGS. 16 and 17 in cross-sectional views. The first connector 120a and the second connector 120b are coupled to contact pads 142 that are coupled to different conductive lines 144, as indicated by a break 144' in the conductive line 144 shown. The insulating material 150 comprises an oxide material that is formed by thermal oxidation of the connectors 120a and 120b, a thermal reflow, other types of oxidation processes, or a deposition process in some embodiments. The insulating material 150 comprises an oxide of a material of the connectors 120a and 120b in some embodiments, such as solder oxide. The insulating material 150 comprises a thickness of about 50 Angstroms to about 200 Angstroms, or about 100 Angstroms, in some embodiments. The insulating material 150 comprises a thickness that is sufficient to provide electrical insulation properties for the first connectors 120a in some embodiments, for example. The insulating material 150 may also comprise other materials and dimensions.

The insulating material 150 is formed on both the first connectors 120a having alignment features 124 formed thereon and also on the second connectors 120b not having alignment features 124 disposed thereon, in some embodiments, as shown in FIG. 16. The insulating material 150 is then removed from the second connectors 120b, as illustrated in FIG. 17. The insulating material 150 may be removed from over the second connectors 120b using a lithography process or other methods in some embodiments.

Figure 18:
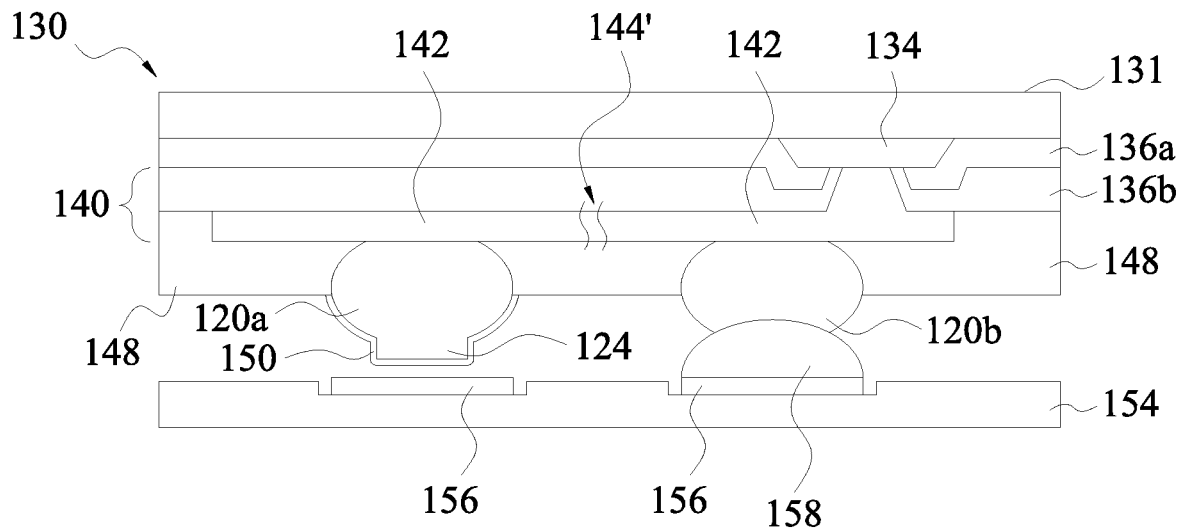
FIG. 18 is a cross-sectional view of a portion of a packaged semiconductor device coupled to a substrate or a printed circuit board (PCB) by connectors not having alignment features disposed thereon in accordance with some embodiments.

The insulating material 150 may also be removed from over the second connectors 120b using a solder paste and flux 158 disposed on contact pads 156 of a substrate or PCB 154, as shown in FIG. 18. The solder paste and flux 158 comprises solder paste with flux, for example. The solder paste and flux 158 may also comprise other materials. The solder paste and flux 158 is not applied to contact pads 156 that the first connectors 120a will be aligned with, in some embodiments. The contact pads 156 of the substrate or PCB 154 for the first connectors 120a may be covered using a solder paste stencil 152 (not shown in FIG. 18; see solder paste stencil 152 shown in FIG. 17) during the application of the solder paste and flux 158, for example. The solder paste and flux 158 may also be applied to all of the contact pads 156 and later removed from contact pads 156 for the first connectors 120a, using a cleaning or other removal process, as another example.

In other embodiments, the insulating material 150 is only formed on the first connectors 120a having alignment features formed thereon, by covering the second connectors 120b with a solder paste stencil 152, as shown in phantom (e.g., in dashed lines) in FIG. 17. After the insulating material 150 is formed on the first connectors 120a, the solder paste stencil 152 is removed from the second connectors 120b.

Other methods may also be used to selectively form the insulating material 150 and/or the solder paste and flux 158, for example.

The second connectors 120b may be used to couple the packaged semiconductor device 130 to another device, such as to a substrate or PCB 154, as illustrated in FIG. 18 in a cross-sectional view. The second connectors 120b may also be used to couple the packaged semiconductor device 130 to other types of devices, such as to another packaged semiconductor device 130 or directly in an end application. The first connectors 120a are used for alignment of the packaged semiconductor device 130 to the substrate or PCB 154 or other device in some embodiments. The insulating material 150 disposed on the first connectors 120a provides electrical isolation for the first connectors 120a in some embodiments, and the first connectors 120a are not electrically or mechanically coupled to the substrate or PCB 154, or other device. The first connectors 120a may also be used for alignment. For example, the alignment features 124 of the first connectors 120a may be used for alignment in wafer and chip probing, laser marking, wafer sawing (i.e., dicing and singulation), and other alignment applications.

The insulating material 150 formed on the first connectors 120a with alignment features 124 may maintain the shape of the alignment features 124 on the first connectors 120a and may provide electrical isolation. The solder paste and flux 158 is not formed on contact pads 156 that the first connectors 120a are aligned with in FIG. 18, for example, and the first connectors 120a may be spaced apart from the contact pads 156 without the solder paste and flux 158. The solder paste and flux 158 used in some embodiments on contact pads 156 that the second connectors 120b not having alignment features are connected to remove the insulating material 150 from the second connectors 120b for solder joint formation.

In other embodiments, the first connectors 120a may not include the insulating material 150 formed thereon, and the first connectors 120a may be electrically and mechanically coupled to the substrate or PCB 154, or other device. The first connectors 120a may be coupled to the same element or electrical function elsewhere in the interconnect structure 140 that the conductive lines 144, contact pads 142, via portions 146, and contacts 134 are coupled to. For example, the first connectors 120a may be coupled to a signal line, a ground line, a power line, or other types of electrical connections or functions in some embodiments.

FIG. 19 is a cross-sectional view of a packaged semiconductor device 130 in accordance with some embodiments of the present disclosure that includes the first connectors 120a with alignment features 124. The first connectors 120a are disposed on corners of the packaged semiconductor device 130 in the embodiments shown. The first connectors 120a that include the alignment features 124 may be included in one or more packaged semiconductor devices 130 formed simultaneously using a wafer-level packaging technique, as illustrated in FIG. 19. The first connectors 120a may also be formed in unused portions of a wafer-level packaging effective wafer, not shown. The first connectors 120a may be included in two or more unused portions of the effective wafer (e.g., comprised of interconnect structures 140a and 140b, molding material 148', and through-vias 162), at unused corner regions, for alignment of the entire effective wafer, in some embodiments.

In some embodiments, the interconnect structure 140a comprises a first interconnect structure 140a disposed proximate a first side of the integrated circuit die 131, and a second interconnect structure 140b is disposed proximate a second side of the integrated circuit die 131, the second side being opposite the first side. Interconnect structures 140a and 140b may include one, two, or several conductive line layers and via layers, as illustrated in the first interconnect structure 140a. The first connectors 120a with alignment features 124 and the second connectors 120b are coupled to contact pads 142 of the first interconnect structure 140a. First connectors 120a' with alignment features 124' and second connectors 120b' may also be coupled to contact pads 142' of the second interconnect structure 140b, as shown in phantom in FIG. 19. The first connectors 120a and 120a' and second connectors 120b and 120b' may be implemented on one of or both of the first interconnect structure 140a and the second interconnect structure 140b.

In accordance with some embodiments, the integrated circuit die 131 is disposed in an integrated circuit die mounting region 164. A package for a semiconductor device, such as the integrated circuit die 131, includes the integrated circuit die mounting region 164 and a molding material 148' disposed around the integrated circuit die mounting region 164. The package includes a plurality of through-vias 162 disposed within the molding material 148', and an interconnect structure 140a and/or 140b disposed over the molding material 148', the plurality of through-vias 162, and the integrated circuit die mounting region 164. The interconnect structure 140a or 140b of the package comprises a plurality of contact pads 142 or 142', and a connector 120a and 120b or 120a' and 120b' is coupled to each of the plurality of contact pads 142 or 142', respectively, of the interconnect structure 140a or 140b. Two or more of the connectors 120a or 120a' comprise an alignment feature 124 disposed thereon. An insulating material 150 is disposed on the two or more of the connectors 120a or 120a', in some embodiments.

A method of packaging the integrated circuit die 131 in accordance with some embodiments will next be described in more detail. In some embodiments, first, a carrier (not shown) is provided, and an integrated circuit die 131 is coupled to the carrier. The carrier may comprise a wafer, tape, or other type of support, substrate, or device that is used for the packaging process as a platform for packaging one or more integrated circuit dies 131. The carrier is later removed after packaging a plurality of the integrated circuit dies 131 in some embodiments, for example.

The integrated circuit die 131 may comprise a substrate having electrical circuitry formed thereon. The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on the substrate, which typically comprises a silicon, other semiconductor material, or glass substrate. Other substrates, such as a multi-layered or gradient substrate may also be used.

The electrical circuitry of the substrate of the integrated circuit die 131 may be any type of circuitry suitable for a particular application. In an embodiment, the electrical circuitry includes electrical devices formed on the substrate with an insulating material comprising one or more dielectric layers overlying the electrical devices. Metal layers may be formed within, on, and/or between the insulating material to route electrical signals between the electrical devices, such as conductive lines and vias. Electrical devices may be formed in one or more dielectric layers of the insulating material. As other examples, electrical circuitry formed within or on the substrate of the integrated circuit die 131 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, or the like. One of ordinary skill in the art will appreciate that the above examples are provided for illustrative purposes to further explain applications of some illustrative embodiments and are not meant to limit the disclosure in any manner. Other circuitry may be used as appropriate for a given application.

In some embodiments, the insulating material of the integrated circuit die 131 or a portion thereof comprises an inter-layer dielectric (ILD) layer that may be formed, for example, of a low dielectric constant (low-K) dielectric material, such as phosphosilicate glass (PSG), borophosphosilicate glass (BPSG), fluorinated silicate glass (FSG), SiOxCy, spin-on-glass (SOG), spin-on-polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma CVD (HDPCVD), or the like. The insulating material may comprise a plurality of dielectric layers in some embodiments. The insulating material or a portion thereof may also comprise one or more inter-metal dielectric (IMD) layers that comprise conductive lines and vias. In some embodiments, the insulating material comprises IMD layers disposed over an ILD layer. Generally, the insulating material of the integrated circuit die 131 may include one or more IMD and/or ILD layers and associated metallization layers that are used to interconnect electrical circuitry of the substrate to each other and also to provide external electrical connections for the integrated circuit die 131. It should be noted that one or more etch stop layers (not shown) may be positioned between adjacent ones of the dielectric layers of the insulating material, for example, between the dielectric layers of the ILD layer and/or the IMD layers of the insulating material. Generally, the etch stop layers provide a mechanism to stop an etching process when forming vias and/or contacts (not shown). The etch stop layers are formed of a dielectric material having a different etch selectivity to adjacent layers, such as the underlying semiconductor substrate and overlying and underlying insulating layers of the insulating material. In some embodiments, etch stop layers of the insulating material may be formed of SiN, SiCN, SiCO, CN, combinations thereof, or the like, deposited by CVD, PECVD, or other methods.

Contacts 134 are formed within, on, and/or through the insulating material of the integrated circuit die 131 to provide an electrical contact to the electrical circuitry of the substrate. The contacts 134 may be formed, for example, using lithography techniques by depositing and patterning a photoresist material over the insulating material to expose portions of the insulating material that are to become the contacts 134. An etch process, such as an anisotropic dry etch process, may be used to create openings in the insulating material. The openings may be lined with a diffusion barrier layer and/or an adhesion layer (not shown), and filled with a conductive material using a damascene process. In some embodiments, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 134 illustrated in FIG. 19. The contacts 134 may also be formed using a subtractive process, by depositing a conductive material over the insulating material of the integrated circuit die 131, and patterning the conductive material using lithography to form the contacts 134. In some embodiments, the contacts 134 may be provided in an uppermost IMD layer of the insulating material of the integrated circuit die 131 (e.g., in an inverted view of the packaged semiconductor device 130 shown) to provide external electrical connections to the electrical circuitry of the substrate.

A plurality of the through-vias 162 may be formed over the carrier by plating, lithography, or other methods, before or after the plurality of the integrated circuit dies 131 is coupled to the carrier. The plurality of through-vias 162 may be formed using an electro-plating process, by depositing a seed layer (not shown) over the carrier, and forming a patterned mask (also not shown) with a desired pattern for the through-vias 162 over the seed layer. The through-vias 162 are plated onto the carrier through the patterned mask, and the patterned mask is then removed. The exposed portions of the seed layer are also removed. The through-vias 162 may comprise copper, a copper alloy, or other metals or conductive materials. Dozens or hundreds of through-vias 162 may be included in a package for each of the integrated circuit dies 131 or groups of integrated circuit dies 131 that are packaged together, for example. The plurality of through-vias 162 provides electric connections in a vertical direction for the packaged semiconductor devices 130 in some embodiments. Each of the plurality of through-vias 162 may be positioned so that they will be coupled to a conductive portion of the interconnect structure(s) 140a and/or 140b that will later be formed, for example.

A plurality of the integrated circuit dies 131 is coupled to the carrier between some of the plurality of through-vias 162 in some embodiments. Only one integrated circuit die 131 is shown in the drawings; in some embodiments, a plurality of integrated circuit dies 131 is coupled to the carrier and is packaged simultaneously. The integrated circuit dies 131 or two or more integrated circuit dies 131 are later singulated along scribe lines (i.e., of the package or interconnect structure 140a or 140b) to form a plurality of packaged semiconductor devices 130. The plurality of integrated circuit dies 131 is coupled to the carrier using a die attach film (DAF) disposed on a bottom surface of the integrated circuit dies 131. The integrated circuit dies 131 are formed on a wafer (not shown), and the integrated circuit dies 131 are singulated along scribe lines to form the plurality of integrated circuit dies 131 in some embodiments. The plurality of integrated circuit dies 131 may be placed on the carrier using a pick-and-place machine or manually, for example.

A molding material 148' is disposed over the carrier, the plurality of integrated circuit dies 131, and the plurality of through-vias 162. The molding material 148' is disposed between the through-vias 162 and integrated circuit dies 131, between adjacent ones of the plurality of through-vias 162, and/or between adjacent ones of the plurality of integrated circuit dies 131, in some embodiments wherein two or more integrated circuit dies 131 are packaged together. The molding material 148' may comprise a molding compound comprised of an insulating material, such as an epoxy, a filler material, a stress release agent (SRA), an adhesion promoter, other materials, or combinations thereof, as examples. The molding material 148' may comprise a liquid or gel when applied so that it flows between and around the connectors 120a and 120b, in some embodiments. The molding material 148' is then cured or allowed to dry so that it forms a solid.

In some embodiments, as deposited, the molding material 148' extends over top surfaces of the plurality of integrated circuit dies 131 and the plurality of through-vias 162, and after the molding material 148' is applied, a top portion of the molding material 148' is removed using a planarization process, such as a CMP process, a grinding process, an etch process, or combinations thereof, as examples. Other methods may also be used to planarize the molding material 148'. A top portion of the integrated circuit dies 131 and/or through-vias 162 may also be removed during the planarization process for the molding material 148'.

Interconnect structure 140a may then be formed over the planarized molding material 148', the integrated circuit dies 131, and the through-vias 162; and/or the carrier may be removed, and interconnect structure 140b is formed on the other side of the molding material 148', the integrated circuit dies 131, and the through-vias 162 after removing the carrier. One or more carriers may be used to package a semiconductor device. In some embodiments, a plurality of the packaged semiconductor devices 130 is then singulated to form a completed packaged semiconductor device 130 that includes a single interconnect structure 140a or 140b. The packaged semiconductor devices 130 may be singulated using a saw (not shown), which may include a blade comprising diamond or other materials in some embodiments, for example.

In other embodiments, the second interconnect structure 140b is formed in addition to the first interconnect structure 140a, before singulating a plurality of the packaged semiconductor devices 130. The first and second interconnect structures 140a and 140b may provide electrical connections in a horizontal direction for a plurality of packaged semiconductor devices 130 in some embodiments, for example. The second interconnect structure 140b comprises back-side routing, and the first interconnect structure 140a comprises front-side routing, e.g., relative to the integrated circuit die 131, for the packaged semiconductor devices 130 in some embodiments.

The methods of packaging semiconductor devices using one or more carriers described herein is merely an example: the integrated circuit dies 131 may be packaged using different methods or orders of a packaging process.

The packaged semiconductor devices 130 comprise fan-out structures in some embodiments. For example, the conductive wiring may be spaced apart farther in the first and second interconnect structures 140a and 140b than conductive wiring of the integrated circuit die 131 is spaced. Likewise, the footprint of contact pads in or on the first and second interconnect structures 140a and 140b may be larger than the footprint of contacts 134 of the integrated circuit die 131.

In some embodiments wherein interconnect structure 140a is formed after the molding material 148' is planarized, the insulating material layer 136a shown in FIG. 8 may be formed. In some embodiments, insulating material layer 136a comprises a passivation layer 136a that is formed over the insulating material and contacts 134 of the integrated circuit die 131. The passivation layer 136a may be formed of a dielectric material, such as SiN, plasma-enhanced oxide (PEOX), plasma-enhanced SiN (PE-SiN), plasma-enhanced undoped silicate glass (PE-USG), or the like. The passivation layer 136a is formed such that at least a portion of the contacts 134 is exposed. The passivation layer 136a may be formed by a blanket deposition and may then be patterned using a lithography process to provide an opening over the contacts 134 and to protect the underlying layers from various environmental contaminants. In some embodiments, a passivation layer 136a is not included.

The insulating material layer 136b comprises a polymer material and is also referred to herein as a polymer layer 136b. The polymer layer 136b is formed over the passivation layer 136a and the contacts 134. The polymer layer 136b may be formed of a polymer such as polybenzoxazole (PBO), polyimide (PI), epoxy, benzocyclobutene (BCB), molding compound, and the like, or a combination thereof. The polymer layer 136b may comprise a thickness of about 3 μm to about 30 μm, for example. The thickness of the polymer layer 136b may be greater than about 30 μm in some embodiments. The formation methods for the polymer layer 136b may include spin-coating, dispensing, thermal compression, CVD, physical vapor deposition (PVD), or other methods, for example. A curing step may be performed to cure the polymer layer 136b. The polymer layer 136b may also comprise other materials, dimensions, and formation methods.

The polymer layer 136b is patterned using a lithography process, by forming a layer of photoresist (not shown) over the polymer layer 136b, and exposing the photoresist to energy reflected from or through a lithography mask (also not shown) having a desired pattern thereon. The photoresist is then developed, and exposed (or unexposed, depending on whether the photoresist comprises a positive or negative photoresist) portions of the photoresist are ashed and/or etched away. The patterned layer of photoresist is then used as an etch mask during an etch process for the polymer layer 136b. The layer of photoresist is then removed using an ashing and/or etch process. The patterned polymer layer 136b comprises an opening over the contacts 134 so that electrical connection may be made to the contacts 134 by the interconnect structure 140.

Next, conductive materials of the interconnect structure 140 are formed over the polymer layer 136b and the contacts 134. The interconnect structure 140 may comprise an RDL that provides electrical connections in a horizontal direction for the packaged semiconductor device in some embodiments, for example. A conductive material is formed over the patterned polymer layer 136b. The conductive material comprises copper, a copper alloy, other metals, or other conductive materials in some embodiments. The conductive material may comprise a thin layer, e.g., comprising a thickness of about 2 µm to about 3 µm or less, of titanium or other seed material that is formed using a sputtering process, and a layer of copper, a copper alloy, or other metal that is electro-plated over the layer of titanium, in some embodiments. The overall thickness of the conductive material comprises about 3 µm to about 30 µm, for example. In other embodiments, the conductive material may be a multi-layered structure, such as a copper layer coated with electro-less nickel or electro-less palladium immersion gold (EN-EPIG), which includes a nickel layer, a palladium layer on the nickel layer, and a gold layer on the palladium layer. The gold layer may be formed using immersion plating. The conductive material may also comprise other materials, dimensions, and formation methods.

The conductive material is then patterned to form the conductive lines 144, contact pads 142, and via portions 146 shown in FIG. 8. The conductive material may be patterned in some embodiments using a lithography process, similar to the lithography process described for the polymer layer 136b, using an etch chemistry suited for the conductive material. The conductive lines 144, contact pads 142, and via portions 146 may also be formed by plating the conductive material through a patterned masking material (not shown) formed over the polymer layer 136b, for example. In some embodiments wherein the conductive material comprises copper or a copper alloy, a plating process may be used to form the conductive material, for example. The masking material is then removed after the plating process.

Additional conductive material layers may also be formed for the interconnect structure 140 comprising similar materials, dimensions, and formation methods as described for the conductive material for the conductive line 144, contact pads 142, and via portion 146. The conductive line 144, contact pads 142, and via portion 146 may comprise a first PPI layer in some embodiments. Additional PPI layers may be formed over the first PPI layer, for example, in embodiments wherein additional conductive lines and via portions are needed for the interconnect structure 140 design, as shown in interconnect structure 140a in FIG. 19.

Connectors 120a and 120b are then coupled to the contact pads 142 in some embodiments, using a method previously described herein with reference to FIGS. 8 and 9. The contact pads 142 are used to connect to the connectors 120a and 120b, forming a connection between the contacts 134 on the integrated circuit die 131 to the connectors 120a and 120b by way of the conductive line 144, via portion 146, and the contact pad 142. The connectors 120a and 120b may have a larger, smaller, or substantially the same diameter than the diameter or width of the contact pads 142.

The molding material 148 is then formed over exposed portions of the second insulating layer 136b and around the connectors 120a and 120b and the contact pad 142 in some embodiments, as shown in FIG. 10 and FIG. 19. The molding material 148 may comprise similar materials and application methods as described for molding material 148' shown in FIG. 19, for example. A top portion of the molding material 148 may be recessed so that a top portion of the connectors 120a and 120b is exposed. An amount of the molding material 148 applied may also be controlled so that the top portion of the connectors 120a and 120b is exposed. A molding compound clamp may be applied during a curing process and a plasma treatment process of the molding material 148 in some embodiments, for example.

Figure 20:
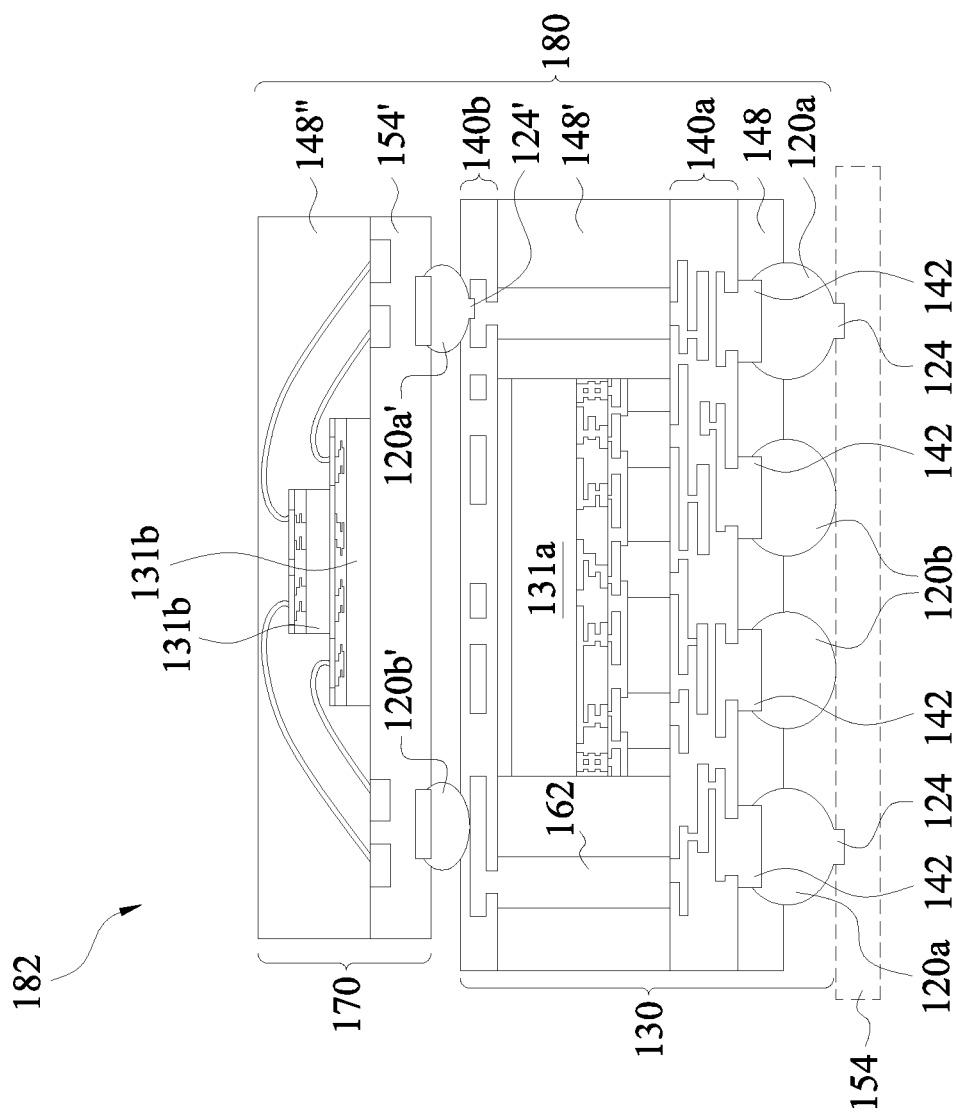
FIG. 20 is a cross-sectional view of a package-on-package (POP) device in accordance with some embodiments, wherein a packaged semiconductor device of the POP device includes the connectors with alignment features described herein.

FIG. 20 is a cross-sectional view of a package-on-package (POP) device 180 in accordance with some embodiments, wherein a packaged semiconductor device of the POP device 180 includes the first connectors 120a with alignment features 124 described herein. A packaged integrated circuit (IC) 170 may be coupled to the first interconnect structure 140a or the second interconnect structure 140b of a packaged semiconductor device 130 to form a POP device 180, for example. In FIG. 20, the packaged semiconductor devices 130 comprise first packaged semiconductor devices 130 that each include an integrated circuit die 131a. The packaged integrated circuits 170 are also referred to herein as second packaged semiconductor devices 170, for example.

Before the packaged semiconductor devices 130 are singulated, and after the second interconnect structure 140b is formed, a plurality of the second packaged semiconductor devices 170 is provided, and each of the plurality of second packaged semiconductor devices 170 is coupled to one of the first packaged semiconductor devices 130 using connectors 120b' or 120a' and 120b' coupled to the second interconnect structure 140b of the first packaged semiconductor devices 130, coupled to the second packaged semiconductor devices 170, or coupled to both the first packaged semiconductor devices 130 and the second packaged semiconductor devices 170. The plurality of second packaged semiconductor devices 170 is coupled to the unsingulated plurality of first packaged semiconductor devices 130 by a method such as manually by an operator or technician, the use of an automated machine such as a pick-and-place machine, or other methods. The plurality of first packaged semiconductor devices 130 is then singulated to form the POP devices 180.

Each of the plurality of second packaged semiconductor devices 170 may comprise a substrate 154' that includes a plurality of contact pads disposed on. The substrate 154' may include one or more interconnect structures (not shown) formed thereon that provide horizontal connections for the plurality of second packaged semiconductor devices 170 in some embodiments. The substrate 154' may also include a plurality of through-vias (also not shown) formed therein. One or more integrated circuit dies 131b may be coupled to a top surface of the substrate 154'. Each of the plurality of second packaged semiconductor devices 170 comprises two vertically stacked integrated circuit dies 131b in the embodiments shown in FIG. 20, for example. Two or more integrated circuit dies 131b may also be packaged together horizontally in the second packaged semiconductor devices 170 in some embodiments, not shown.

In some of the embodiments shown, the integrated circuit dies 131b are coupled to contact pads disposed on a top surface of the substrate 154' by bond wires. The bond wires and through-vias in the substrate 154' provide vertical electrical connections for the plurality of second packaged semiconductor devices 170 in some embodiments. A molding material 148" is disposed over the integrated circuit dies 131b, the bond wires, and the substrate 154'. The molding material 148" may comprise similar materials as described for the molding materials 148 or 148' of the plurality of first packaged semiconductor devices 130, for example.

In some embodiments, the integrated circuit die or dies 131b may comprise dynamic random access memory (DRAM) devices, for example. The integrated circuit dies 131b may also comprise other types of devices. One or more integrated circuit dies 131b may be included in the second packaged semiconductor devices 170. The integrated circuit dies 131b may be packaged in a wire bond type of package as shown in FIG. 20, or the integrated circuit dies 131b may be packaged in other types of packages and using other types of packaging techniques.

After the second packaged semiconductor devices 170 are coupled to the first packaged semiconductor devices 130 using the plurality of connectors 120b' or 120a' and 120b', as shown in FIG. 20, a eutectic material of the connectors 120b' or 120a' and 120b' is then reflowed, which mechanically and electrically couples the second packaged semiconductor devices 170 to the first packaged semiconductor devices 130. Each of the plurality of second packaged semiconductor devices 170 is coupled to one of the plurality of first packaged semiconductor devices 130 using some of the plurality of connectors 120b' or 120a' and 120b', for example. The plurality of first packaged semiconductor devices 130 and the plurality of second packaged semiconductor devices 170 are arranged in an array of rows and columns in some embodiments. A plurality of scribe lines is disposed in an x direction and y direction between the plurality of first packaged semiconductor devices 130 and the plurality of second packaged semiconductor devices 170 in some embodiments. The POP devices 180 are then singulated along the scribe lines.

The POP devices 180 may then be coupled to another device or object using the plurality of connectors 120b or 120a and 120b disposed on the bottom surfaces of the POP devices 180, e.g., using a surface mount technology (SMT) process. In some embodiments, the POP devices 180 may be coupled to a substrate 154, shown in phantom in FIG. 20, to form a chip-on-wafer-on-substrate (CoWoS) device 182. The POP devices 180 include the packaged semiconductor devices 130 that include the first connectors 120a or 120a' and the second connectors 120b or 120b', or the first connectors 120a and 120a' and the second connectors 120b and 120b' described herein.

Figure 21:
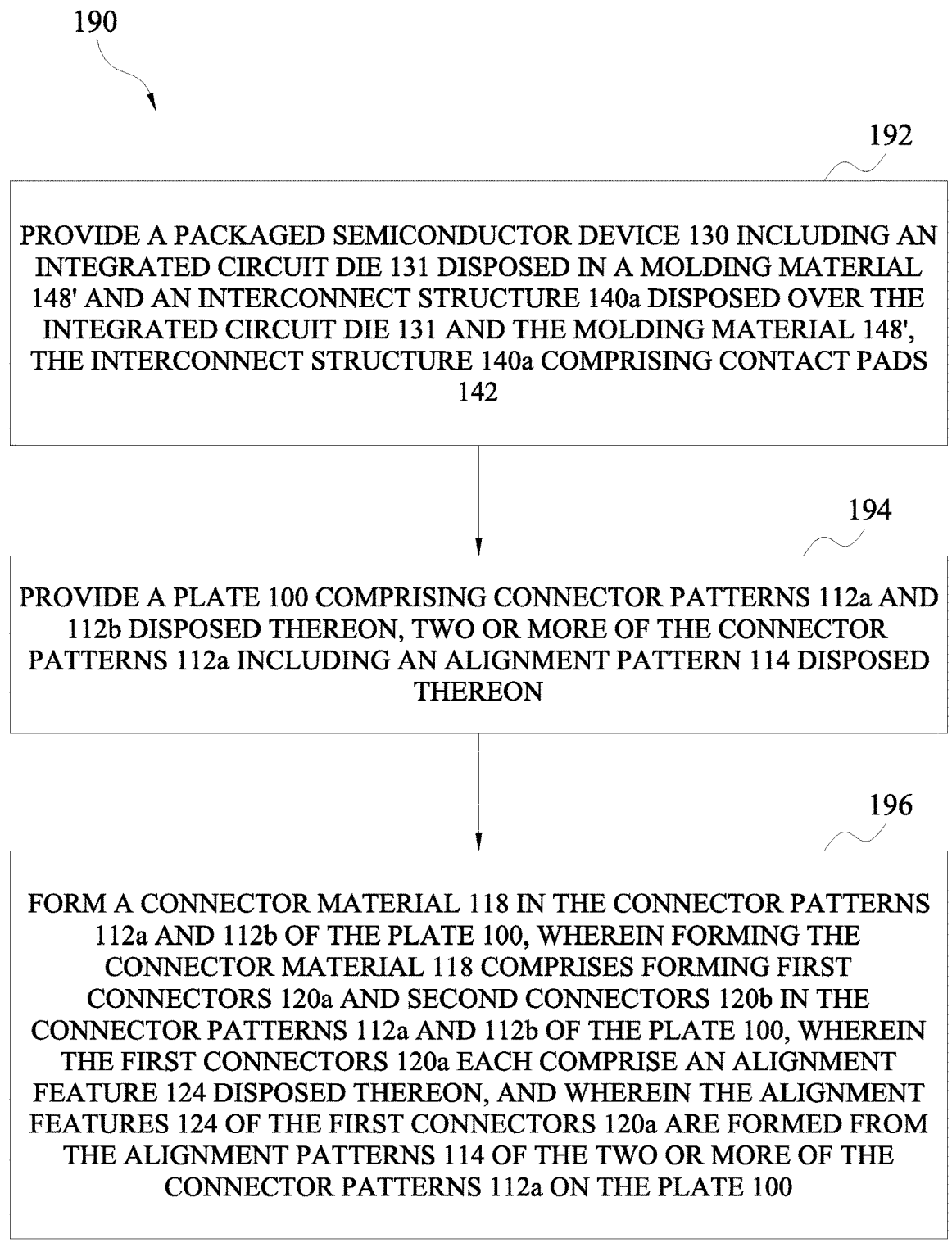
FIG. 21 is a flow chart of a method of packaging a semiconductor device in accordance with some embodiments of the present disclosure.

FIG. 21 is a flow chart 190 of a method of packaging a semiconductor device in accordance with some embodiments of the present disclosure. In step 192, a packaged semiconductor device 130 (see also FIG. 19) is provided that includes an integrated circuit die 131 disposed in a molding material 148' and an interconnect structure 140a disposed over the integrated circuit die 131 and the molding material 148'. The interconnect structure 140a includes a plurality of contact pads 142. In step 194, a plate 100 (see also FIG. 2) is provided that comprises a plurality of connector patterns 112a and 112b disposed thereon, wherein two or more of the plurality of connector patterns 112a include an alignment pattern 114 disposed thereon. In step 196, a connector material 118 (see also FIG. 6) is formed in the plurality of connector patterns 112a and 112b of the plate 100, wherein forming the connector material 118 comprises forming a plurality of first connectors 120a and a plurality of second connectors 120b (see FIG. 7) in the plurality of connector patterns 112a and 112b of the plate 100, wherein the plurality of first connectors 120a each comprises an alignment feature 124 disposed thereon, and wherein the alignment features 124 of the plurality of first connectors 120a are formed from the alignment patterns 114 of the two or more of the plurality of connector patterns 112a on the plate 100.

The packaging method further comprises coupling each of the plurality of second connectors 120b to a contact pad 156 of a substrate or PCB 154 in some embodiments, as shown in FIG. 18. In some embodiments, the packaging method further comprises aligning the packaged semiconductor device 130 using the alignment features 124 of the plurality of first connectors 120a. As examples, aligning the packaged semiconductor device 130 may comprise aligning the packaged semiconductor device 130 for a connection process (such a connection process to a substrate or PCB 154 or other device), a wafer probe process, a chip probe process, a laser marking process, or a singulation process. Other alignment functions may also be performed on the packaged semiconductor device 130 using the alignment features 124.

Some embodiments of the present disclosure are advantageously implementable in and are particularly beneficial when used in POP devices 180, in some applications. The packaged semiconductor devices may also comprise system-on-a chip (SOC) devices, chip-on-wafer-on-substrate (CoWoS) devices, or other types of 3DICs in some embodiments, as examples. Embodiments of the present disclosure are also beneficial for and may be implemented in other types of devices or wafer level packaging that include interconnect structures and fan-out structures, as other examples.

In some embodiments, the integrated circuit dies 131 comprise first integrated circuit dies 131a that comprise logic devices or processors and the first packaged semiconductor devices 130 comprise fan-out wiring, and the second integrated circuit dies 131b comprise memory devices such as DRAM devices, e.g., in some embodiments wherein the first connectors 120a that include the alignment features 124 described herein are implemented in an integration fan-out (InFO) POP device 180. In some embodiments, the second packaged semiconductor devices 170 include a plurality of stacked integrated circuit dies 131b comprising DRAM devices, for example. The first integrated circuit dies 131a, the second integrated circuit dies 131b, the first packaged semiconductor devices 130, and the second packaged semiconductor devices 170 may also comprise other types of devices, and the first connectors 120a that include the alignment features 124 and processes described herein may also be implemented in other types of applications.

Some embodiments of the present disclosure include packaged semiconductor devices 130 and POP devices 180 that include the alignment features 124 on connectors 120a. Some embodiments include interconnect structures 140 and packages for semiconductor devices that include the alignment features 124 on connectors 120a. Other embodiments include methods of packaging semiconductor devices.

Some advantages of some embodiments of the present disclosure may include providing packaging methods and structures for wafer-level packages (WLPs), wafer-level chip scale packages (WLCSPs), POP devices and other types of 3DICs, and other types of packages. The packaging methods and structures include alignment features on connectors so that additional alignment structures and methods are not required. Only two to four connectors may be required for the alignment processes in some embodiments, so that the remainder of connectors of the BGA of the package may be utilized for electrical connections, and also resulting in fewer contact pad loss. The alignment features of the connectors may be used for alignment in wafer and chip probing, laser marking, wafer sawing (i.e., dicing and singulation), connecting the packaged semiconductor devices to another device or object, and other alignment applications.

An insulating material is formed on the connectors with alignment features in some embodiments, which maintains the shape of the alignment features on the connectors and provides electrical isolation. A solder paste with flux is used in some embodiments on contact pads that connectors not having alignment features are connected to, which removes the insulating material for solder joint formation.

The connectors with alignment features are formed using borofloat glass plates in some embodiments, which have a CTE close to the CTE of the silicon of integrated circuit dies, resulting in improved alignment of the connectors to contact pads of the integrated circuit dies. Forming the connectors using the plates results in improved yields. The connectors with alignment features comprise solder ball structure designs for low cost yield enhancement of packaging processes, for example. Back end process wafer final yields are enhanced in some embodiments. Furthermore, the packaging methods and structures described herein are easily implementable into existing packaging process flows and structures.

In some embodiments, a package for a semiconductor device includes an integrated circuit die mounting region, a molding material disposed around the integrated circuit die mounting region, and an interconnect structure disposed over the molding material and the integrated circuit die mounting region. The interconnect structure includes a plurality of contact pads. A connector is coupled to each of the plurality of contact pads. Two or more of the connectors include an alignment feature disposed thereon.

In some embodiments, a packaged semiconductor device includes a molding material, an integrated circuit die disposed within the molding material, and a plurality of through-vias disposed within the molding material. An interconnect structure is disposed over the molding material, the plurality of through-vias, and the integrated circuit die. The interconnect structure includes a plurality of contact pads. A connector is coupled to each of the plurality of contact pads of the interconnect structure. Two or more of the connectors comprise an alignment pattern disposed thereon. The two or more of the connectors including the alignment pattern disposed thereon include an insulating material disposed thereon.

In some embodiments, a method of packaging a semiconductor device includes providing a packaged semiconductor device including an integrated circuit die disposed in a molding material and an interconnect structure disposed over the integrated circuit die and the molding material. The interconnect structure includes a plurality of contact pads. A plate is provided that includes a plurality of connector patterns disposed thereon. Two or more of the plurality of connector patterns includes an alignment pattern disposed thereon. The method includes forming a connector material in the plurality of connector patterns of the plate. Forming the connector material comprises forming a plurality of first connectors and a plurality of second connectors in the plurality of connector patterns of the plate. The plurality of first connectors each comprises an alignment feature disposed thereon. The alignment features of the plurality of first connectors are formed from the alignment patterns of the two or more of the plurality of connector patterns on the plate.

In some embodiments, a method includes forming a first connector in a first recess of a connector plate, the first recess having a first pattern shape at a bottom thereof. A second connector is formed in a second recess of the connector plate, the second recess lacking the first pattern shape at a bottom thereof. The first connector and the second connector are transferred to a first package device, the first connector including an alignment feature corresponding to the first pattern shape. A second package device is aligned to the first package device based on a position of the alignment feature of the first connector. The second package device is bonded to the first package device by the second connector.

In some embodiments, a method includes patterning a plate to form a first set of connector patterns and a second set of connector patterns, where each of the first set of connector patterns and second set of connector patterns include a cavity, where the first set of connector patterns further includes an alignment pattern formed at a bottom of each cavity at a depth greater than a depth of the second set of connector patterns. Each of the cavities is filled with an eutectic material to form first connectors and second connectors, the first connectors corresponding to the first set of connector patterns, the first connectors each including an alignment pattern formed thereon, the second connectors corresponding to the second set of connector patterns. The first connectors and second connectors are transferred to respective contact pads of a first package. One or more of the first or second connectors are bonded to a second package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a packaged semiconductor device including an integrated circuit die disposed in a molding material and an interconnect structure disposed over the integrated circuit die and the molding material, the interconnect structure comprising a plurality of contact pads;
providing a plate comprising a plurality of connector patterns disposed thereon, two or more of the plurality of connector patterns including an alignment pattern disposed thereon;
forming a plurality of first connectors and a plurality of second connectors in the plurality of connector patterns of the plate, wherein forming the plurality of first connectors and the plurality of second connectors comprises filling the entirety of the plurality of connector patterns of the plate with a homogeneous material, wherein the plurality of first connectors each comprises an alignment feature disposed thereon, and wherein the alignment features of the plurality of first connectors are formed from the alignment patterns of the two or more of the plurality of connector patterns on the plate;

removing of each of the plurality of first connectors and the plurality of second connectors from respective ones of the plurality of connector patterns of the plate such that the plurality of first connectors and the plurality of second connectors are separate from the plate; and coupling each of the plurality of first connectors and the plurality of second connectors to respective ones of the plurality of contact pads.

2. The method according to claim 1, further comprising coupling each of the plurality of second connectors to a contact pad of a substrate or printed circuit board (PCB).

3. The method according to claim 1, further comprising aligning the packaged semiconductor device using the alignment features of the plurality of first connectors.

4. The method according to claim 3, wherein aligning the packaged semiconductor device comprises a process selected from the group consisting essentially of: a connection process, a wafer probe process, a chip probe process, a laser marking process, a singulation process, and combinations thereof.

5. The method according to claim 1, wherein providing the plate comprises providing a borofloat glass plate.

6. The method according to claim 1, wherein providing the plate comprises providing an unpatterned plate, and wherein the method further comprises patterning the unpatterned plate with the plurality of connector patterns using a lithography process.

7. The method according to claim 6, wherein patterning the unpatterned plate comprises forming cavities in the unpatterned plate, and wherein the cavities comprise a re-entrant angle of about 30 degrees to about 90 degrees.

8. The method according to claim 6, wherein patterning the unpatterned plate comprises patterning the unpatterned plate using a half-tone lithography mask.

9. A method of packaging a semiconductor device, the method comprising:
forming a first connector in a first recess of a connector plate, the first recess having a first pattern shape at a bottom thereof;
forming a second connector in a second recess of the connector plate, the second recess lacking the first pattern shape at a bottom thereof, wherein forming the first connector and the second connector comprises filling the first recess and the second recess with a conductive material using solder paste printing and reflowing the conductive material in the first recess and the second recess;
transferring the first connector and the second connector to a first package device, the first connector comprising a first alignment feature corresponding to the first pattern shape, wherein transferring the first connector and the second connector to the first package device comprises removing the first connector from the first recess of the connector plate and removing the second connector from the second recess of the connector plate;
aligning a second package device to the first package device based on a position of the first alignment feature of the first connector; and
bonding the second package device to the first package device by the second connector.

10. The method of claim 9, wherein following bonding the second package device to the first package device, the first connector remains unbonded to the second package device.

11. The method of claim 9, wherein the first connector comprises a first portion having a ball shape including a rounded top and sides and a second portion having vertical sidewalls and a planar top surface protruding from the rounded top of the first portion, wherein the second portion comprises the first alignment feature.

12. The method of claim 9, wherein the first recess and the second recess of the connector plate are formed by patterning the connector plate using a lithography process that includes a lithography mask that comprises MoSi.

13. The method of claim 9, further comprising:
aligning a substrate to the second package device based on a position of a second alignment feature of a third connector on the second package device, wherein the second alignment feature corresponds to the first pattern shape; and
bonding the second package device to the substrate using a fourth connector.

14. The method of claim 9, wherein the first package device comprises an integrated circuit die disposed in a molding material.

15. A method comprising:
patterning a plate to form a first set of connector patterns and a second set of connector patterns, wherein each of the first set of connector patterns and second set of connector patterns comprise a cavity, wherein the first set of connector patterns further comprises a respective alignment pattern formed at a bottom of each cavity at a depth greater than a depth of the second set of connector patterns, each respective alignment pattern having a particular shape;
filling each of the cavities with an eutectic material to form first ball connectors and second ball connectors, the first ball connectors corresponding to the first set of connector patterns, the first ball connectors each comprising a raised alignment feature corresponding to the respective alignment pattern at the bottom of each cavity of the first set of connector patterns, each respective raised alignment feature having sidewalls which protrude vertically from a curved surface of a respective first ball connector, the second ball connectors corresponding to the second set of connector patterns;
transferring a first of the first ball connectors and a first of the second ball connectors to a first package device, and transferring a second of the first ball connectors and a second of the second ball connectors to a second package device;
bonding the first package device to the second package device by reflowing the eutectic material of the first and the second of the first ball connectors and the first and the second of the second ball connectors; and
bonding the second package device to a substrate using a third of the first ball connectors and a third of the second ball connectors.

16. The method of claim 15, further comprising:
aligning the second package device to the substrateusing an alignment pattern of the third of the first ball connectors.

17. The method of claim 15, further comprising:
electrically coupling the second of the first ball connectors to a signal, ground, or power connector of the second package device.

18. The method of claim 15, wherein a first cavity of one of the first set of connector patterns and a second cavity of one of the second set of connector patterns have the same width.

19. The method of claim 15, wherein each of the first of the first ball connectors, the second of the first ball connectors and the third of the first ball connectors comprise raised alignment features that are different from each other.

20. The method of claim 15, wherein each respective raised alignment feature has a lesser width than the respective first ball connector.

\* \* \* \* \*